United States Patent [19]

Smith et al.

[11] Patent Number: 4,632,723
[45] Date of Patent: Dec. 30, 1986

[54] ORIENTATION FILTERING FOR CRYSTALLINE FILMS

[75] Inventors: Henry I. Smith, Sudbury; Harry A. Atwater, Somerville; Carl V. Thompson, Watertown; Michael W. Geis, Acton, all of Mass.

[73] Assignee: Massachusetts Institute of Technology, Cambridge, Mass.

[21] Appl. No.: 481,096

[22] Filed: Mar. 31, 1983

[51] Int. Cl.$^4$ ............................................. C30B 13/06
[52] U.S. Cl. ..................... 156/617 R; 156/DIG. 111; 156/DIG. 65; 156/DIG. 88
[58] Field of Search ........... 156/603, 617 R, DIG. 88, 156/DIG. 65, DIG. 64, DIG. 111, 644; 148/13; 427/86, 53.1, 93

[56] References Cited

U.S. PATENT DOCUMENTS 4,333,792 6/1982 Smith .......................... 156/DIG. 88
4,479,846 10/1984 Smith et al. .......................... 156/603

OTHER PUBLICATIONS

Geis et al., Appl. Phys. Lett. 37(5) 9/80, pp. 454–456.

*Primary Examiner*—Hiram H. Bernstein
*Attorney, Agent, or Firm*—Charles Hieken

[57] ABSTRACT

A substrate is coated with a film to be recrystallized. A pattern of crystallization barriers is created in the film, for example, by etching voids in the film. An encapsulation layer is generally applied to protect the film, fill the voids and otherwise enhance a recrystallization process. Recrystallization is carried out such that certain orientations pass preferentially through the barrier, generally as a result of growth-velocity anisotropy. The result is a film of a specific predetermined crystallographic orientation, a range of orientations or a set of discrete orientations.

5 Claims, 7 Drawing Figures

ORIENTATION FILTERING FOR CRYSTALLINE FILMS

The U.S. Government has rights in this invention pursuant to Department of Energy Contract No. DE-AC02-80-ER13019l.

TECHNICAL FIELD

This invention relates to semiconductor fabrication and, in general, to the growth of crystalline films with defined crystallographic orientations.

BACKGROUND OF THE INVENTION

Attention is directed to a commonly-assigned U.S. patent application by two of the inventors herein, Geis and Smith, Ser. No. 391,130, filed June 23, 1982, now U.S. Pat. No. 4,479,846, granted Oct. 30, 1984, entitled METHOD OF ENTRAINING DISLOCATIONS AND OTHER CRYSTALLINE DEFECTS IN HEATED FILM CONTACTING PATTERNED REGION hereby incorporated by reference.

Films of crystalline material are important in many areas of technology. In semiconductor electronics there is considerable interest in developing means of producing device-quality films of silicon (Si) and other semiconductors (especially the III-V compounds, HgCdTe and other infrared detectors) on insulating substrates such as $SiO_2$. Foreign substrates having high thermal conductivity are also of interest. It is a goal of intensive current research to develop means of producing crystalline films on foreign substrates while ensuring that the crystallographic and chemical perfection of the films approaches that of bulk crystalline materials. In the application of crystalline films to solar photovoltaics, it is important that processes for producing said films be compatible with low cost mass production.

In recent years numerous investigators have produced large-grain polycrystalline films of Si on $SiO_2$ by melting fine-grain polycrystalline Si using a laser, a strip-heater, or a bright lamp, and then allowing the melt to resolidify. The most effective techniques to date involve forming an elongated molten zone and scanning this zone across a film (see, for example, M. W. Geis, H. I. Smith, et al. "Zone-Melting Recrystallization of Si Films With a Movable-Strip Heater Oven", J. Electrochem. Soc. 129, 2812 (1982)). Some difficulties with current zone-melting recrystallization (ZMR) are: (a) in the absence of a single-crystal seed, a film will generally consist of many grains, each with a different orientation; and (b) within grains there are subboundaries and other defects distributed more-or-less randomly.

The copending application, Ser. No. 391,130 referenced above, describes a technique that solves difficulty (b). We have developed a planar constriction technique (H. A. Atwater, H. I. Smith, M. W. Geis, "Orientation Selection by Zone-Melting Silicon Films Through Planar Constrictions", Appl. Phys. Lett. 41, 747 (1982)) which enables one to ensure that the film beyond the constriction is of a single orientation; a solution to difficulty (a). However, although the film has a single orientation, the particular orientation it has is not predictable or controllable. That is, the orientation can take on any value over a range ($\pm \sim 20°$ in the case of Si ZMR).

It is an object of this invention to provide a means of selecting, predetermining or filtering the crystallographic orientation or orientations of a film.

It is a further object of this invention to utilize competition in growth from several distinct grains to accomplish this orientation filtering.

It is a further object of this invention to utilize patterns to induce orientation filtering.

It is a further object of this invention to obtain large grains of a selected orientation.

SUMMARY OF THE INVENTION

According to the invention, a film to be processed is located on top of a substrate and, in some cases, is covered with an encapsulation layer. A pattern, called *the filter*, is created in or on the film, in or on the substrate, or in or on the encapsulation layer. The film is processed by passing a hot zone through it in such a way that the filter selects out either a single crystallographic orientation, a range of crystallographic orientations, or a limited number of discrete orientations.

Numerous other features, objects and advantages of the invention will become apparent from the following description of preferred embodiments when read in conjunction with the accompanying drawings.

DESCRIPTION OF THE PREFERRED EMBODIMENTS

Figure 1:
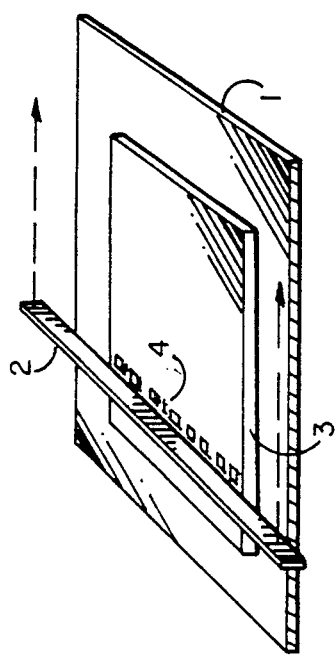
FIG. 1 is a perspective view of an apparatus used for zone-melting recrystallization.
Figure 2:
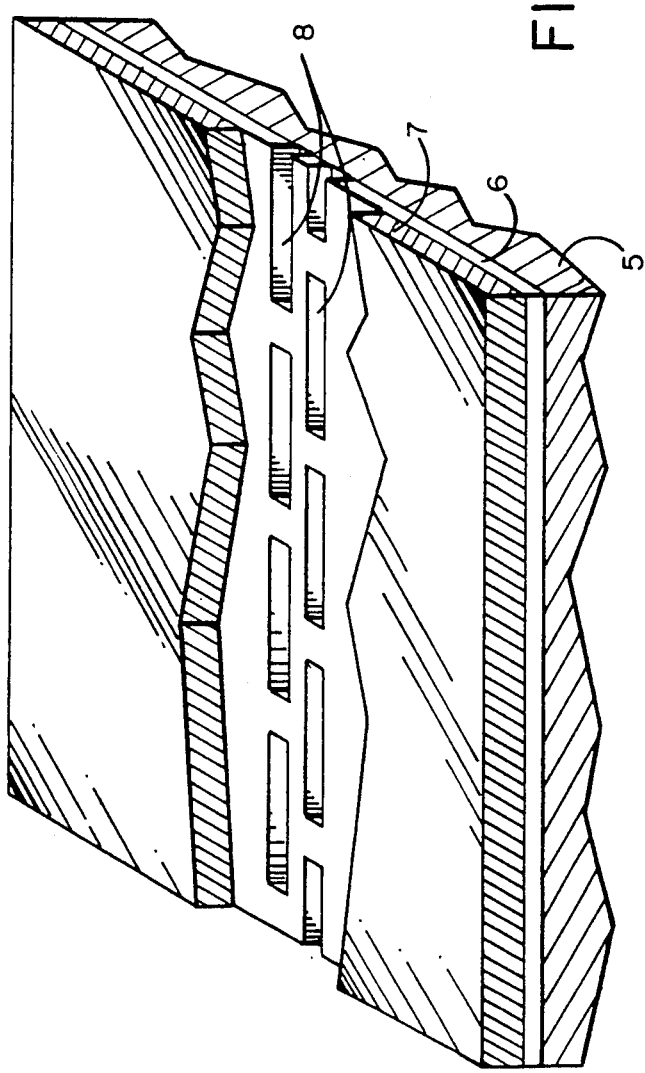
FIG. 2 is a perspective drawing of a sample containing an orientation filter pattern.

With reference now to the drawings, there is shown in FIG. 1 an apparatus for zone-melting-recrystallization consisting of a lower strip-heater, 1, an upper strip-heater, 2, a sample, 3, and an elongated molten zone, 4. The arrow indicates that the molten zone is scanned across the sample surface. Other means of creating a molten zone such as with a laser, an electron beam or a lamp would also be suitable and would fall within the compass of this invention. FIG. 2 is a perspective drawing of a sample with its upper layer, 7, partially cut away to reveal an orientation filter pattern consisting of an array of rectangular-shaped voids to serve as crystallization barriers, 8. The substrate, 5, is coated with a film, 6, to be recrystallized. For example, a film of thermally-grown $SiO_2$ on a Si wafer can be used as a substrate. On top of this substrate, 5, a thin film, 6, to be recrystallized is deposited. For example, we have used films of fine-grain polycrystalline silicon with thicknesses of approximately ½ micrometer ($\mu$m), deposited by chemical vapor deposition (CVD) means. On top of this film, an encapsulation layer, 7, is shown. This encapsulation layer can be a composite of 2 $\mu$m thickness of $SiO_2$, 30 nm of $Si_3N_4$. An array pattern of rectangular-shaped voids, 8, is shown formed in the film, 6. This pattern of crystallization barriers constitutes an orientation filter. The voids can be formed, for example, by selective chemical etching of the Si following a photolithographic step. The voids are typically filled (not shown in FIG. 2) with the material of the encapsulation layer during deposition of said layer. The compositions of the layers that constitute the sample, their thicknesses and the geometry of the filter pattern are subject to ones control and can be varied over a wide range. All such variations which fall within the basic principles of this invention are included within the scope of this invention.

Once a sample has been properly prepared with an orientation filter, a recrystallization process is carried out. In this context we use the term "recrystallization" to encompass both the traditional meaning (i.e., solid-state processes involving grain nucleation and/or growth) and melting followed by directional solidification, in accord with recent usage. Typically, an elongated zone of recrystallization is created in which the long axis is generally parallel to the long axis of the orientation filter pattern, and the zone is moved across the sample in a direction perpendicular to the long axes.

Figure 3:
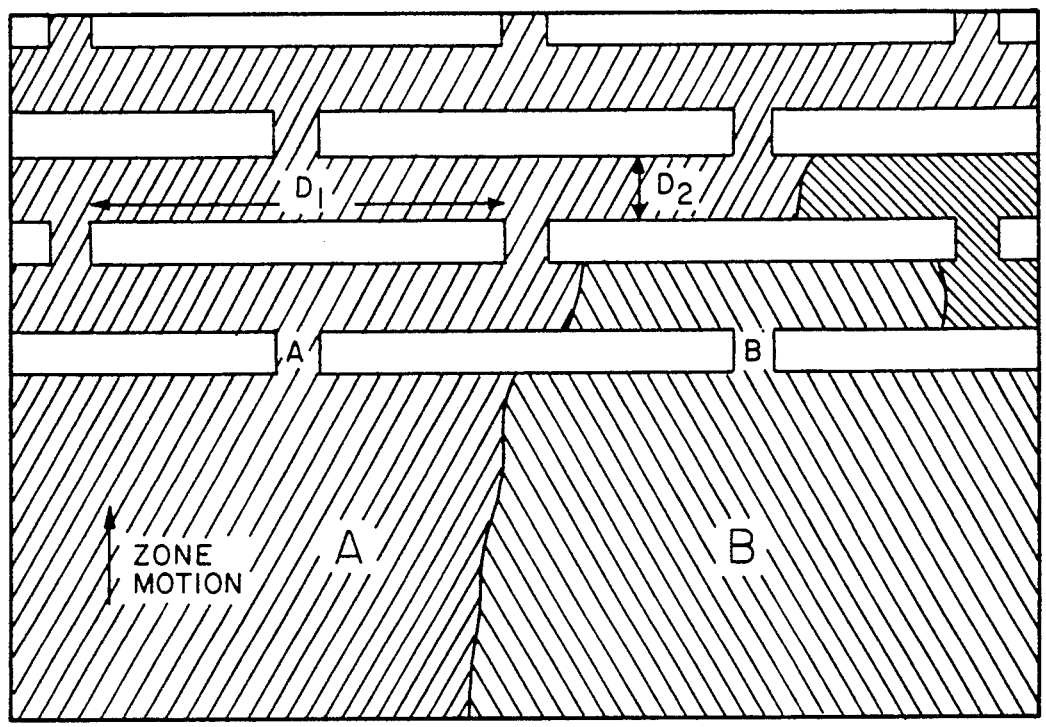
FIG. 3 is a schematic plan view illustrating the operation of a particular type of orientation filter.

The principle of this invention can be understood by reference to FIG. 3 which is a schematic plan view of one technique for orientation filtering. Let us assume, for purposes of illustration, that a molten zone is created using an apparatus such as in FIG. 1, and the recrystallization occurs by solidification (i.e., crystal growth) into the trailing edge of the moving molten zone. FIG. 3 depicts a situation in which two crystal grains, A and B, having two different crystallographic orientations, grow in the general direction of zone motion and enter the two constrictions a and b at substantially the same time. These constrictions correspond to the regions between the voids (the crystallization barriers) depicted in FIG. 2. To pass through the constriction c, a crystal must grow laterally. The grain which reaches c first (depicted as A in FIG. 3) will pass through and thereby occlude growth from crystal B. Beyond c, additional stages of filtering are depicted, implying that this process of patterned occlusion can be repeated many times. As depicted in FIG. 3, growth velocity determines which crystal first arrives at the constriction c. In the case of Si on SiO$_2$, encapsulated by a composite of SiO$_2$ and Si$_3$N$_4$, growth velocity depends on crystallographic orientation. Hence, the growth-velocity competition to pass through c that is depicted in FIG. 3 results in a selection of crystallographic orientation. For this reason we apply the name orientation filtering to this invention.

Figure 4:
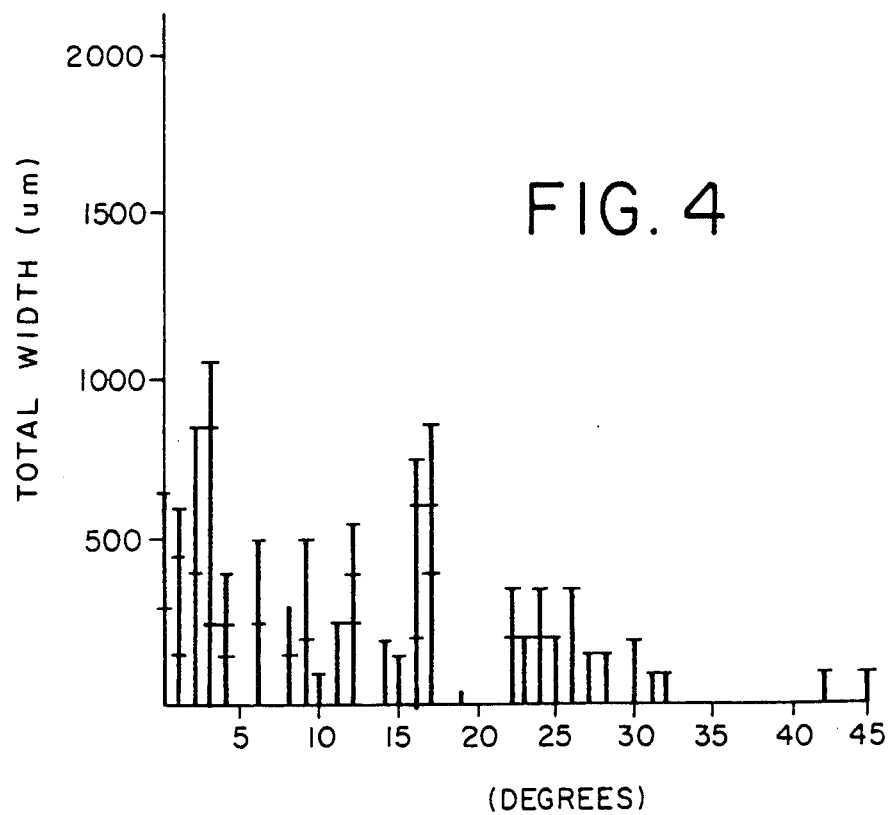
FIG. 4 shows experimental data for grain orientation in ZMR without an orientation filter.
Figure 5:
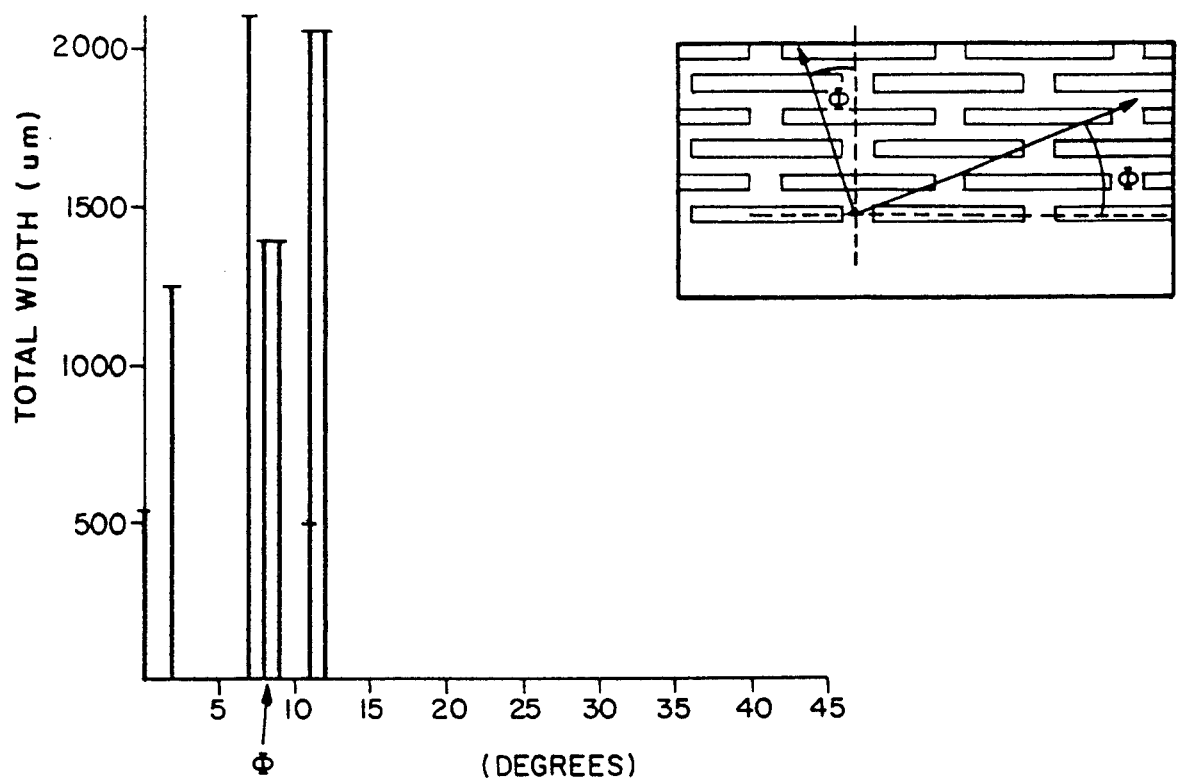
FIG. 5 shows experimental data after recrystallization through an orientation filter, the inset to FIG. 5 relates the angle $\phi$ to the filter geometry.

In experiments performed with Si on SiO$_2$ we observed statistical preference for selecting out orientations in which the <100> crystallographic direction is parallel to the shortest distance between a and c, a result we predicted theoretically. This is illustrated in FIGS. 4 and 5. FIG. 4 depicts the distribution of in-plane <100> crystallographic orientations approximately 1 mm after the transition region, and immediately in front of an orientation filter pattern, such as shown in FIG. 3. Each vertical bar of the histogram represents the orientation of a single grain. FIG. 5 illustrates the distribution of in-plane <100> crystallographic orientations immediately after the recrystallization (i.e., solidification) has passed through the filter pattern. Referring to FIG. 3, $d_1 = 180$ $\mu$m and $d_2 = 15\mu$. By the sketch shown in the inset to FIG. 5 this should correspond to an angle $\phi$ given by $\phi = \tan^{-1} (15/90) = 9.5$ degrees. Note that after filtering there are no grains with angular orientation beyond about 13 degrees, that the grains are typically wider than 1 mm and that the most probable orientations are in a narrow range close to 10 degrees. This may be a result of the fact that 9.5 degrees corresponds to a <100> crystallographic direction extending directly from one constriction to the nearest constriction in the next line of barriers, as depicted in the inset to FIG. 5.

Figure 6:
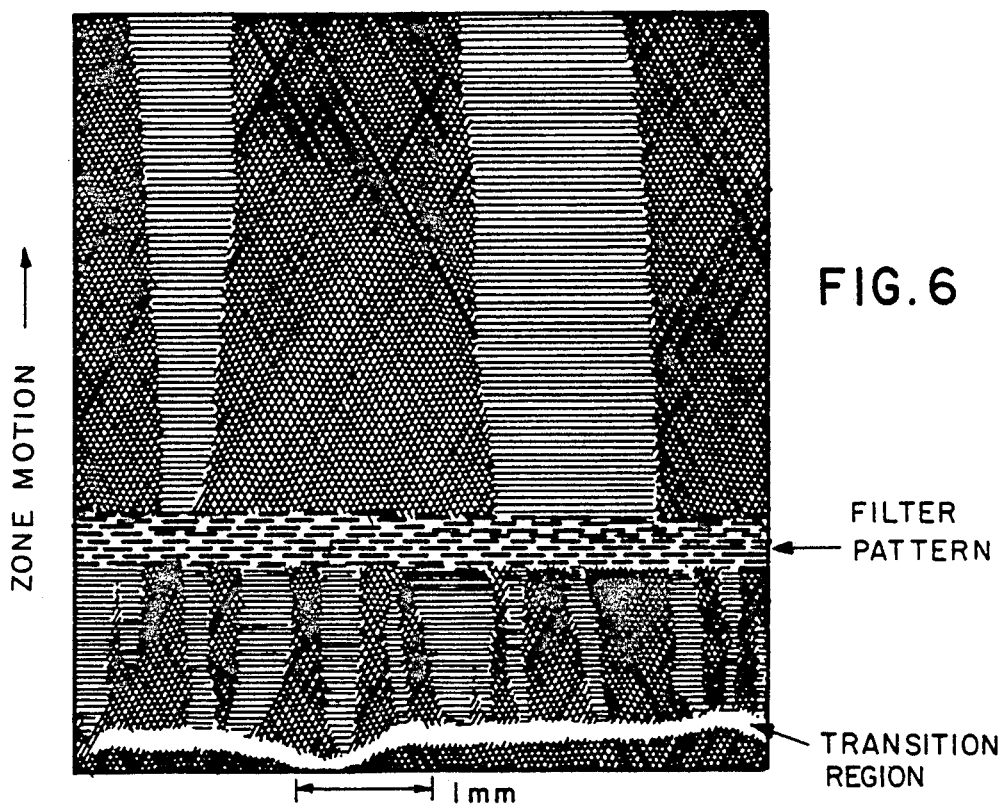
FIG. 6 is a photomicrograph illustrating the effect of orientation filtering on grain size and orientation distribution.

FIG. 6 is a photomicrograph illustrating the appearance of a recrystallized Si film before and after orientation filtering. The distinct grains were made to stand out clearly by etching a grid of etch pits in the Si film and illuminating the film obliquely. Note the multiplicity of grains entering the filter and the small number of large grains after passage through the filter pattern.

EQUIVALENTS

It should be clear that those skilled in the art of crystal growth given the information and guidance provided in this specification can readily devise alternative filter patterns that achieve results differing from the results shown in FIGS. 5 and 6. For example, to reduce the magnitude of the most probable angle, one can reduce the ratio $d_2/d_1$. Moreover, the filter pattern can be asymmetric and/or non-repetitive to achieve orientation biasing and/or grain-diameter enhancement. One skilled in the art can also recognize the desirability of having a very large number of grain orientations present at the start of the filtering process in order to increase the probability that grains with the most suitable orientation would be available to win the growth-velocity competition. This effect has been demonstrated. We found that excellent results were obtained if the so-called transition region, (the region where solidification was initiated which consists of a large number of small grains having a multiplicity of orientations, see copending patent application Ser. No. 391,130 referenced above), was located within the filter pattern.

Figure 7:
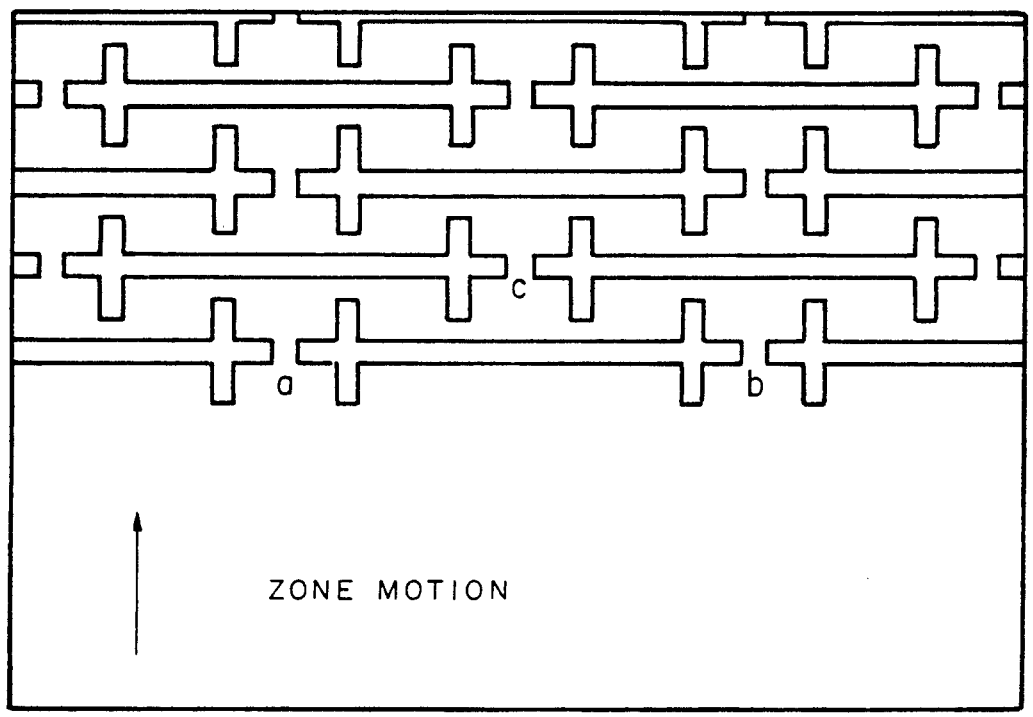
FIG. 7 depicts an orientation filter that eliminates the direct line of sight.

Depending on the desired end result one can design and fabricate an appropriate filter pattern. For example, the filter pattern depicted in FIG. 7 eliminates the direct line of sight from constrictions a and b to constriction c in order to obtain a narrow spread of orientation about zero degrees. One of the ideas of orientation filtering is that the pattern may be designed so that the desired orientation, or set of orientations, corresponds to minimum time for growth from one constriction to the next so as to occlude other orientations.

Although we have described orientation filtering in which crystals grow by solidification into the melt, the inventive concept of orientation filtering applies also to purely solid-state processes, including amorphous to crystalline growth and the various well known grain enlargement processes. Furthermore, the filter pattern need not be a pattern of voids filled with encapsulation material, as described above. It might, for example, consist of locally doped regions to serve as barriers. Filtering may be feasible by patterning the top layer with materials that favor one or another crystallographic texture. Clearly, the invention is not limited to Si films or SiO$_2$ substrates or encapsulation layers.

There has been described novel apparatus and techniques for orientation filtering to produce novel articles of manufacture. It is evident that those skilled in the art may now make numerous uses and modifications of and departures from the specific embodiments described herein without departing from the inventive concepts. Consequently, the invention is to be construed as embracing each and every novel feature and novel combination of features present in or possessed by the apparatus and techniques herein disclosed and limited solely by the spirit and scope of the appended claims.

What is claimed is:

1. A method of forming a crystalline film with a modified distribution of crystallographic orientations upon a substrate, the method comprising:
   (a) depositing a film to be processed upon the surface of a substrate;
   (b) etching a pattern of crystallization barriers in the film; and
   (c) heating the film to induce recrystallization, whereby the pattern of barriers will prevent the growth of non-conforming orientations.

2. The method of claim 1 wherein the method further comprises covering the film with an encapsulation layer after the pattern is established.

3. The method of claim 1 wherein said step of etching a pattern of crystallization barriers in the film creates voids in the film and the method further comprises covering the film with an encapsulation layer after the film has been etched so as to fill the voids formed by etching with the encapsulating material.

4. The method of claim 1 wherein the step of heating the film further comprises passing a heated zone through the film.

5. The method of claim 4 wherein the step of establishing a pattern further comprises establishing a pattern of rectangular-shaped voids having their long axes perpendicular to the direction in which the heated zone is subsequently passed through the film.

* * * * *